United States Patent
Chen

(10) Patent No.: US 12,016,174 B2
(45) Date of Patent: Jun. 18, 2024

(54) SEMICONDUCTOR DEVICE AND METHOD FOR FORMING THE SAME

(71) Applicant: Fujian Jinhua Integrated Circuit Co., Ltd., Quanzhou (CN)

(72) Inventor: Min-Teng Chen, Quanzhou (CN)

(73) Assignee: Fujian Jinhua Integrated Circuit Co., Ltd., Quanzhou (CN)

( * ) Notice: Subject to any disclaimer, the term of this patent is extended or adjusted under 35 U.S.C. 154(b) by 177 days.

(21) Appl. No.: 17/673,804

(22) Filed: Feb. 17, 2022

(65) Prior Publication Data

US 2023/0070343 A1    Mar. 9, 2023

(30) Foreign Application Priority Data

Sep. 9, 2021 (CN) .......................... 202111057606.5
Sep. 9, 2021 (CN) .......................... 202122186271.9

(51) Int. Cl.
*H10B 12/00* (2023.01)

(52) U.S. Cl.
CPC ........... *H10B 12/315* (2023.02); *H10B 12/03* (2023.02); *H10B 12/482* (2023.02)

(58) Field of Classification Search
CPC ..... H01L 28/90; H10B 12/03; H10B 12/0335; H10B 12/315; H10B 12/482
See application file for complete search history.

(56) References Cited

U.S. PATENT DOCUMENTS

| | | | |
|---|---|---|---|
| 5,413,950 A * | 5/1995 | Chen .................... | H10B 12/318 257/E21.012 |
| 2014/0054538 A1* | 2/2014 | Park ..................... | H10B 63/845 257/5 |
| 2018/0174971 A1* | 6/2018 | Song ..................... | H10B 12/033 |

* cited by examiner

*Primary Examiner* — Michelle Mandala
*Assistant Examiner* — Kevin Quinto
(74) *Attorney, Agent, or Firm* — Winston Hsu

(57) ABSTRACT

A semiconductor device includes a substrate, a plurality of bit lines, a plurality of contacts, a plurality of storage node pads, a capacitor structure and a plurality of first interface layers. The bit lines and the contacts are disposed on the substrate, and the contacts are alternately and separately disposed with the bit lines. The storage node pads are disposed on the contacts and the bit lines, and are respectively aligned with the contacts. The capacitor structure is disposed on the storage node pads. The first interface layers are disposed between the storage node pads and the capacitor structure, and the first interface layers include a metal nitride material. The first interface layers may improve the granular size of the storage node pads, and reduce the surface roughness thereof, and further improve the electrical connection between the storage nodes and transistor components below.

14 Claims, 11 Drawing Sheets

SEMICONDUCTOR DEVICE AND METHOD FOR FORMING THE SAME

BACKGROUND OF THE INVENTION

1. Field of the Invention

The present invention relates to a semiconductor device and the method for forming the same, in particular to a semiconductor memory device and the method for forming the same.

2. Description of the Prior Art

With the trend of miniaturization of various electronic products, the design of semiconductor memory devices must meet the requirements of high integration and high density. For a dynamic random access memory (DRAM) having recessed gate structures, because the carrier channel of which is relatively long in the same semiconductor substrate compared with that of the DRAM without recessed gate structures, the leakage current from the capacitor structure in the DRAM can be reduced. Therefore, the DRAM having recessed gate structures has gradually replaced DRAM having planar gate structures under the current mainstream development trend.

Generally, the DRAM having recessed gate structure is constructed by a large number of memory cells which are arranged to form an array area, and each of the memory cells can be used to store information. Each memory cell may include a transistor element and a capacitor element connected in series, which is configured to receive voltage information from word lines (WL) and bit lines (BL). In order to fulfill the requirements of advanced products, the density of memory cells in the array area must be further increased, which increases the difficulty and complexity of related fabricating processes and designs. Therefore, the present technology needs further improvement to effectively improve the efficiency and reliability of related memory devices.

SUMMARY OF THE INVENTION

An object of the present invention is to provide a method for forming a semiconductor device, in which interfaces layers are formed on storage node pads (SN pad) and/or bottom electrode layers through at least one surface treatment, so as to improve the granular size of the storage node pads and/or the bottom electrode layers, and reduce the surface roughness thereof. In addition, the interface layers may function like nucleation layers so as to shorten the forming time of the conductive layer formed subsequently and to further optimize the forming method of the semiconductor device.

An object of the present invention is to provide a semiconductor device, which includes interface layers disposed above storage node pads and/or below or inside bottom electrode layers to improve the granular size of the storage node pads and/or the bottom electrode layers, and reduce the surface roughness thereof. Therefore, the present invention may obtain a semiconductor device with a more optimized structure, and further improve the electrical connection between the storage nodes and transistor components below.

To achieve the above objective, one embodiment of the present invention provides a method for forming a semiconductor device, which includes the following steps. Providing a substrate, and forming a plurality of bit lines on the substrate. A plurality of contacts are formed on the substrate, and the bit lines and the contacts are alternately arranged. A plurality of storage node pads are formed on the contacts and the bit lines, and the storage node pads are respectively aligned with each of the contacts. Forming a capacitor structure on the storage node pads, wherein the capacitor structure includes a plurality of capacitors which are respectively aligned with each of the storage node pads. Forming first interface layers between the storage node pads and the capacitors, and the first interface layers include a metal nitride material.

To achieve the above objective, one embodiment of the present invention provides a semiconductor device, which includes a substrate, a plurality of bit lines, a plurality of contacts, a plurality of storage node pads, a capacitor structure and a first interface layer. The bit lines and the contacts are disposed on the substrate, and the contacts are alternately and separately disposed with the bit lines. The storage node pads are arranged on the contacts and the bit lines, and are respectively aligned with each of the contacts. The capacitor structure is disposed on the storage node pads, and the capacitor structure includes a plurality of capacitors respectively aligned with each of the storage node pads. The first interface layers are disposed between the storage node pads and the capacitors, and the first interface layers include a metal nitride material.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-5 are schematic diagrams illustrating steps of a method for forming a semiconductor device according to the first embodiment of the present invention, in which:

FIG. 1 is a schematic cross-sectional view of a semiconductor device after forming a support structure;

FIG. 2 is a schematic cross-sectional view of a semiconductor device after performing a surface treatment;

FIG. 3 is a schematic cross-sectional view of a semiconductor device after performing another surface treatment;

FIG. 4 is a schematic cross-sectional view of a semiconductor device after forming a bottom electrode layer; and FIG. 5 is a schematic cross-sectional view of a semiconductor device after forming a top electrode layer.

FIGS. 6-10 are schematic diagrams illustrating steps of a method for forming a semiconductor device according to the second embodiment of the present invention, in which:

FIG. 6 is a schematic cross-sectional view of a semiconductor device after forming a conductive layer;

FIG. 7 is a schematic cross-sectional view of a semiconductor device after performing another surface treatment;

FIG. 8 is a schematic cross-sectional view of a semiconductor device after forming another conductive layer;

FIG. 9 is a schematic cross-sectional view of a semiconductor device after removing part of the support layer; and FIG. 10 is a schematic cross-sectional view of a semiconductor device after forming a top electrode layer.

DETAILED DESCRIPTION

For better understanding of the present invention, some embodiments of the present invention are listed below with the accompanying drawings, the composition and the desired effects of the present invention are described in detail for those skilled in the art. Those skilled in the art can replace, recombine and mix the features of several different embodiments with reference to the following examples to complete other embodiments without departing from the scope of the present invention.

Figure 1:
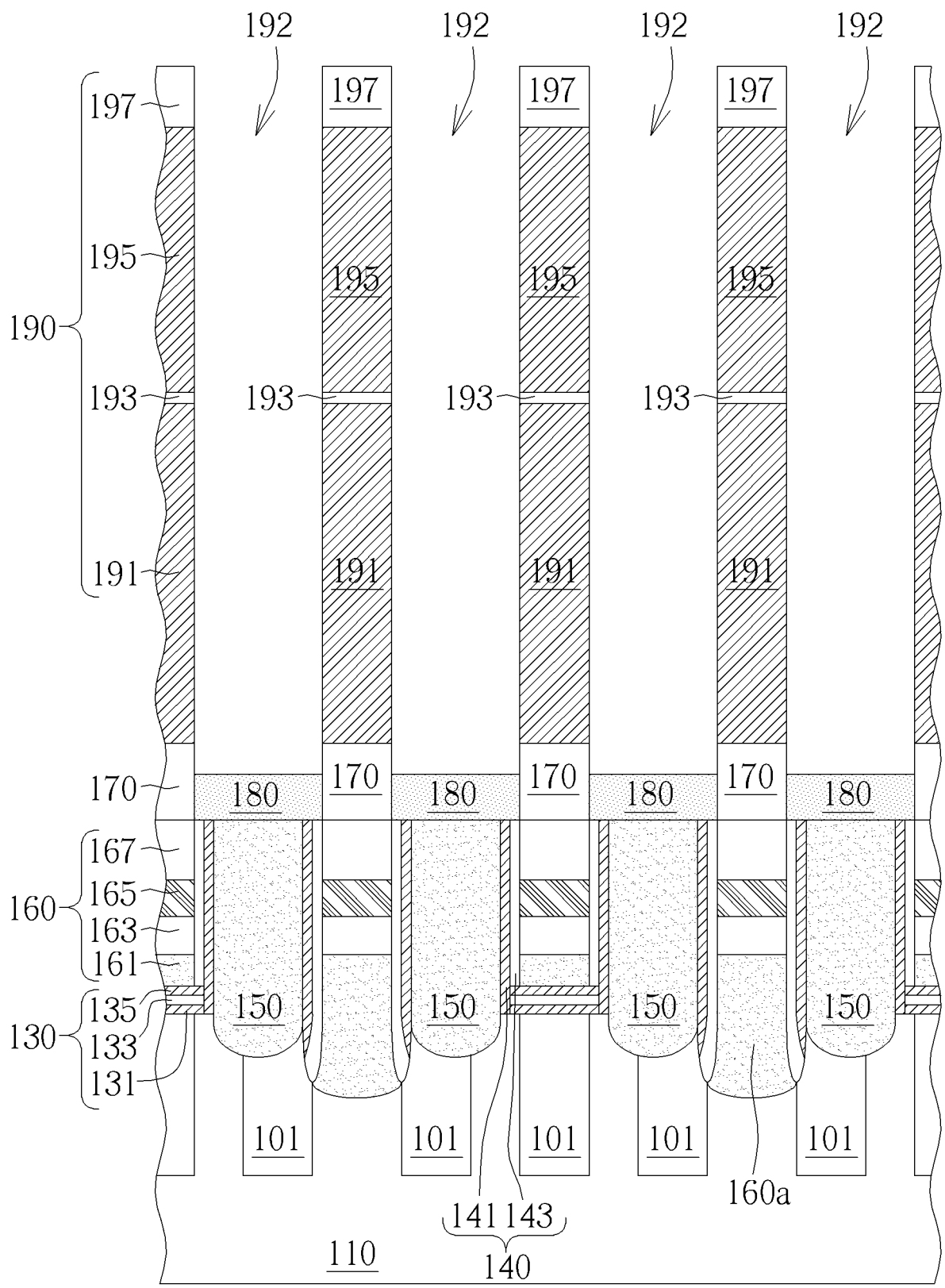

Please refer to FIGS. 1-5, which are schematic diagrams illustrating steps of a method for forming a semiconductor device 300 in the first embodiment of the present invention. First, as shown in FIG. 1, a substrate 110 is provided, such as a silicon substrate, a silicon-containing substrate (such as SiC, SiGe) or a silicon-on-insulator (SOI) substrate, and at least one insulation area 101, such as a shallow trench isolation (STI), is formed in the substrate 110, and defines a plurality of active areas (AA, not shown) on the substrate 110. In one embodiment, the at least one insulation area 101 is formed by etching a plurality of trenches (not shown in the drawings) in the substrate 110, and then the trenches are filled with an insulation material (such as silicon oxide or silicon oxynitride), but it is not limited thereto.

In addition, a plurality of buried gates (not shown) may be formed in the substrate 110, for example, the buried gates extend parallel to each other in a first direction (such as the x-direction, not shown), and across the active area to serve as buried word lines (BWL, not shown) of the semiconductor device 300. A plurality of bit lines 160 and a plurality of contacts 150 may be formed on the substrate 110, which extend in a second direction (such as the y-direction, not shown) perpendicular to the first direction, and the bit lines 160 and the contacts 150 are alternately arranged with each other. Although the overall extension directions of the active areas, the buried gates and the bit lines 160 are not shown in the corresponding figures, it should be easily understood by those skilled in the art that the bit lines 160 should be perpendicular to the buried gate to cross the active areas and the buried gates simultaneously from a top view.

In detail, the bit lines 160 are formed on the substrate 110 separately from each other, and each of the bit lines 160 includes a semiconductor layer 161 (such as polysilicon), a barrier layer 163 (such as titanium and/or titanium nitride), a conductive layer 165 (such as metals with low resistance such as tungsten, aluminum or copper), and a cap layer 167 (such as silicon oxide, silicon nitride or silicon oxynitride) sequentially stacked. It should be noted that a portion of the bit lines 160 are formed on a dielectric layer 130 above the substrate 110, preferably, the dielectric layer 130 has a composite layer structure, such as an oxide-nitride-oxide (ONO) structure, but not limited thereto. Another portion of the bit lines 160 have bit line contacts (BLCs) 160a formed below, which may further extend into the substrate 110. In particular, the portion of the bit lines 160 and the another portion of the bit lines 160 may be alternately arranged with each other, the bit line contacts 160a and the semiconductor layer 161 of the another portion of the bit lines 160 are monolithic, and the bit line contacts 160a are in direct contact with the substrate 110 (the active region) below. On the other hand, the contacts 150 are also formed on the substrate 110 separately from each other, and further extend into the substrate 110, each of the contacts 150 may thereby be used as a storage node contact (SNC) of the semiconductor device 300, and is in direct contact with the substrate 110 below (including the active areas and the insulation areas 101). In one embodiment, the contacts 150 include low-resistance metal materials such as aluminum (Al), titanium (Ti), copper (Cu) or tungsten (W), and each of the contacts 150 and each of the bit lines 160 are insulated from each other by spacer structures 140. In one embodiment, the spacer structures 140 may optionally have a monolayer structure, or a multilayer structure, which includes, for example, a first spacer 141 (for example, containing silicon oxide) and a second spacer 143 (for example, containing silicon nitride) sequentially stacked as shown in FIG. 1, but is not limited thereto.

Referring to FIG. 1 again, a plurality of storage node pads (SN pad) 180 are also formed in a dielectric layer 170 on the substrate 110, and each of the storage node pads 180 are located above the contacts 150 and the bit lines 160 and respectively aligned with the contacts 150. In one embodiment, the storage node pads 180 may also include low-resistance metal materials such as aluminum, titanium, copper or tungsten, for example, a metal material different from the contact 150, but not limited thereto. In another one embodiment, the storage node pads and the contacts 150 may optionally be monolithic and contain the same material. Subsequently, capacitor structures 220 may be formed on the storage node pads 180 to be in direct contact with and electrically connected with the storage node pads 180 below. In one embodiment, the fabricating process of the capacitor structures 220 include but not limited to the following steps. First, a support layer structure 190 is formed above the substrate 110, and includes at least one oxide layer and at least one nitride layer stacked alternately. In the present embodiment, the support layer structure 190 includes, for example, a first support layer 191 (including silicon oxide, for example), a second support layer 193 (including silicon nitride or silicon carbonitride, for example), a third support layer 195 (including silicon oxide, for example), and a fourth support layer 197 (including silicon nitride or silicon carbonitride, for example) sequentially stacked from bottom to top, but not limited thereto. Preferably, the first support layer 191 and the third support layer 195 may have a relatively large thickness, for example, about 5 times to 10 times or more than that of the other support layers (the second support layer 193 or the fourth support layer 197), as shown in FIG. 1, but not limited thereto. Therefore, the overall thickness of the support layer structure 190 may reach but not limited to about 1600 angstroms to 2000 angstroms. It should be understood by those skilled in the art that the specific stacking numbers of the aforementioned oxide layers (such as the first support layer 191 or the third support layer 195) and the aforementioned nitride layer (such as the second support layer 193 or the fourth support layer 197) are not limited to the aforementioned number, but may be adjusted according to actual requirements, such as 3 layers, 4 layers or other numbers. Then, a plurality of openings 192 are formed in the support layer structure 190, and sequentially penetrate through the fourth support layer 197, the third support layer 195, the second support layer 193 and the first support layer 191 to align with the storage node pads 180 below. Thus, each of the storage node pads 180 may be exposed from each of the corresponding openings 192, as shown in FIG. 1.

Figure 2:
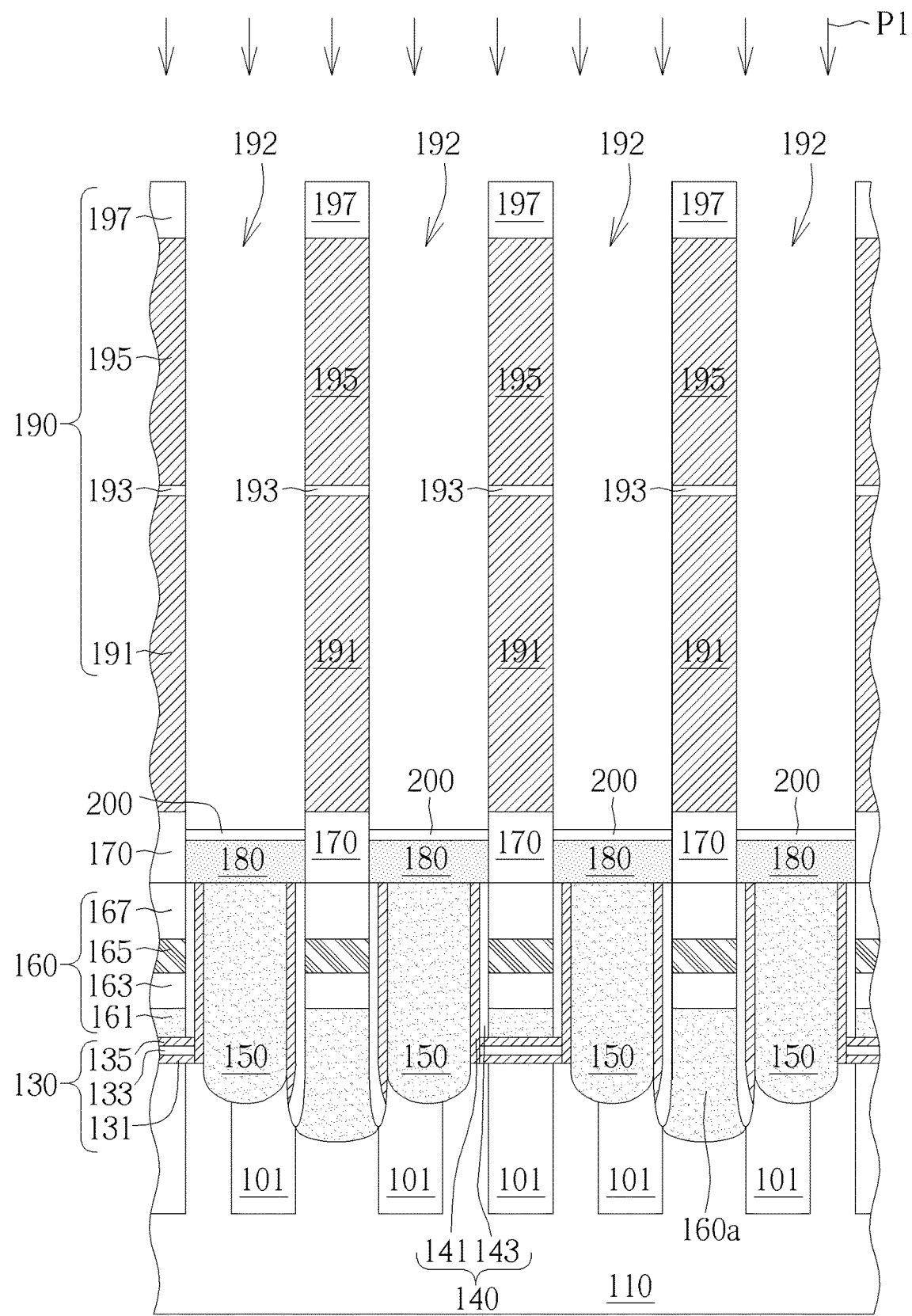

Then, as shown in FIG. 2, a first surface treatment P1 is performed on the storage node pads 180 to selectively form first interface layers 200 on the storage node pads 180. In one embodiment, the first surface treatment P1 is, for example, a nitrogen treatment, in which nitrogen gas is introduced to react with the exposed surfaces of the storage node pads 180 to improve the granular size of the storage node pads 180, thereby reducing the surface roughness thereof. Therefore, the first interface layers 200 may include a metal nitride material such as tungsten nitride (WN), aluminum nitride (AlN), titanium nitride (TiN) or copper nitride (CuN), or a metal oxynitride material, but not limited thereto. It should be noted that the first interface layers 200 may also be functioned like nucleation layers in the subsequent formation of the bottom electrode layers, thereby shortening the forming time of the bottom electrode layer.

Figure 3:
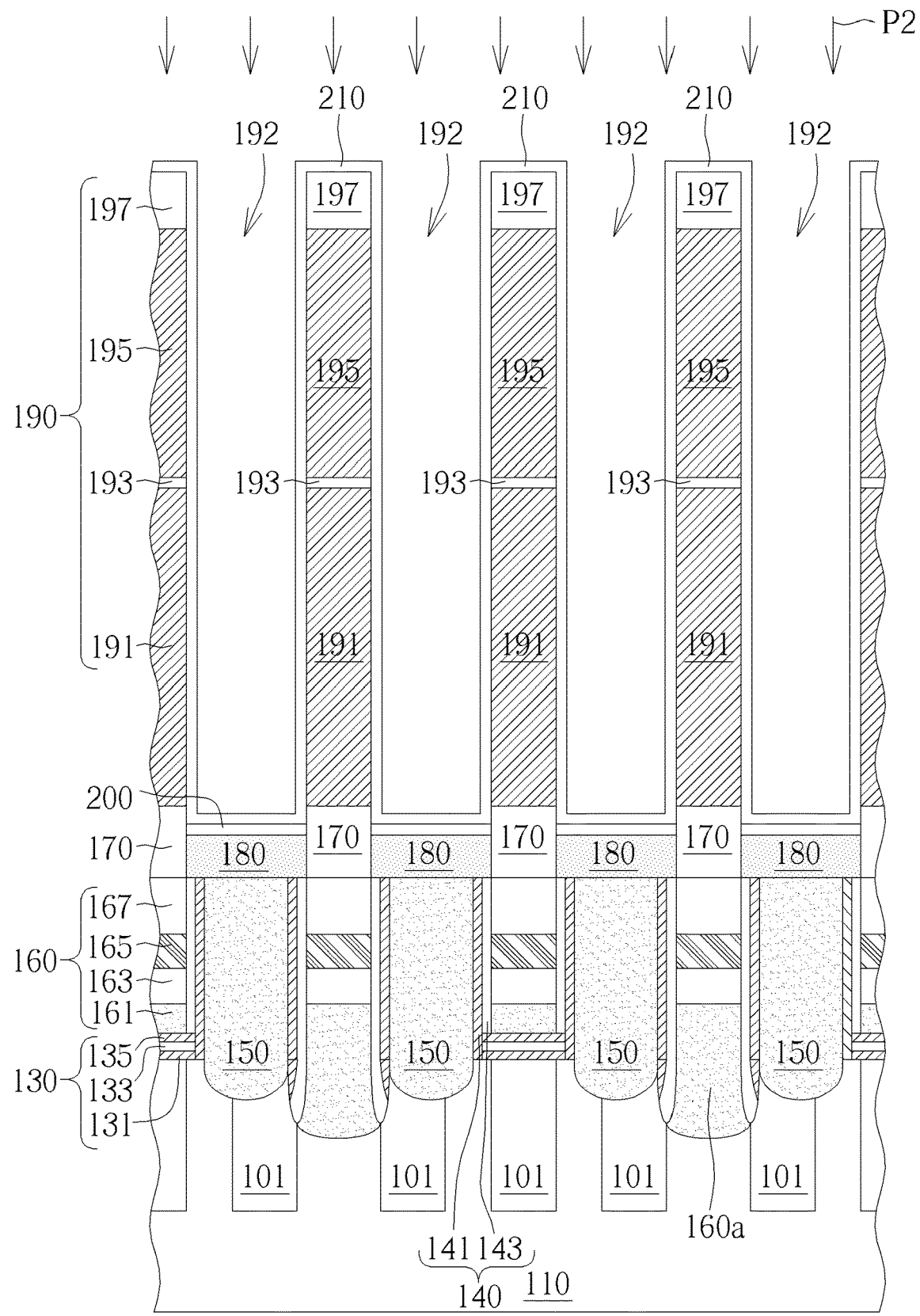
Figure 4:
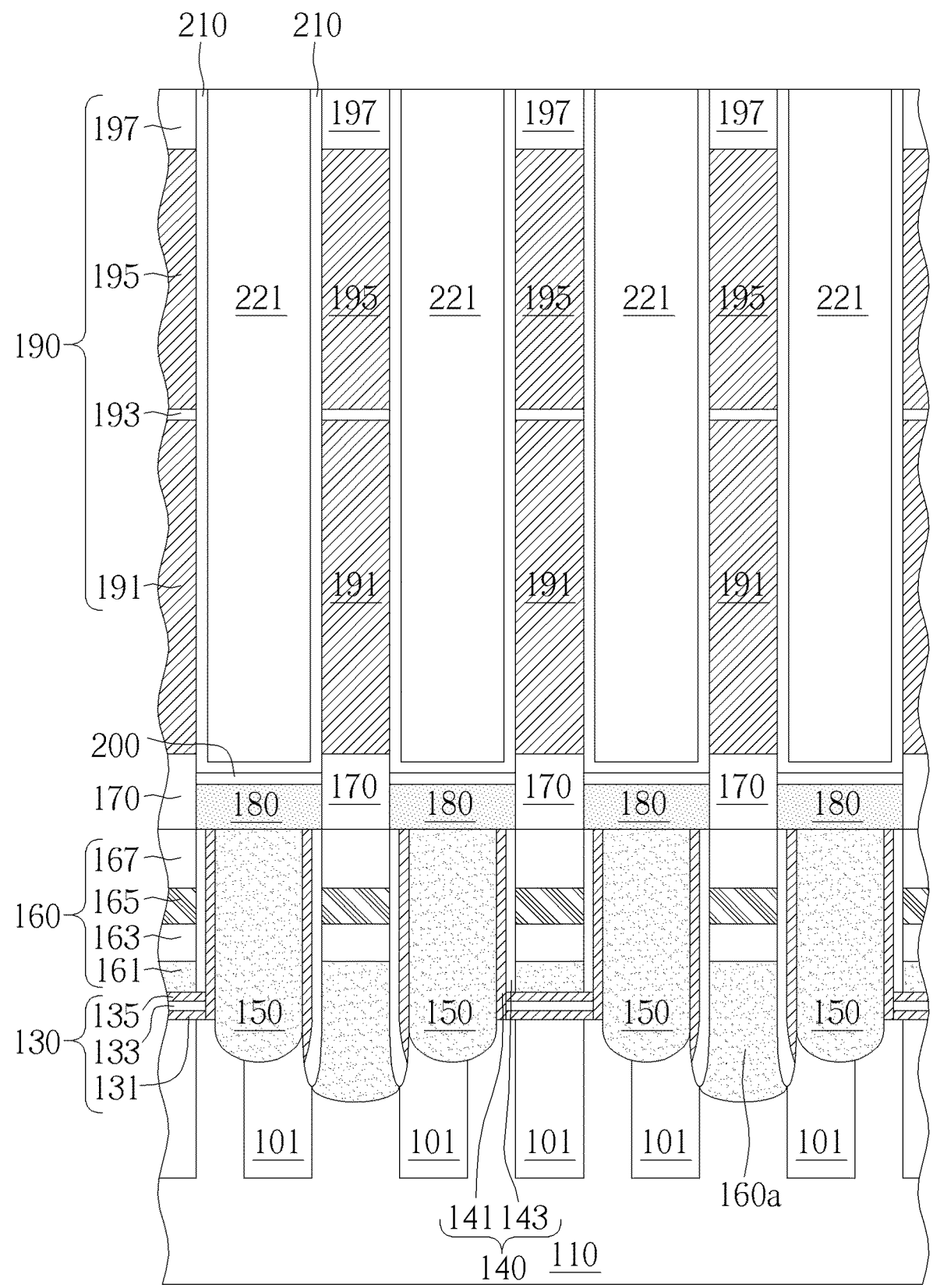

Then, as shown in FIG. 3, after the first interface layers 200 are formed, a second surface treatment P2 is performed in the openings 192 to form a second interface layer 210. Preferably, the second surface treatment P2 is an ex-situ treatment, in which oxygen is introduced under vacuum relief to carry out an oxidation treatment to react with surfaces of the openings 192 and the first interface layers 200, and the second interface layer 210 may thereby be conformally formed on the surfaces of the openings 192 and the first interface layers 200, as shown in FIG. 3. Therefore, the second interface layer 210 may include a metal oxide material (which contains very little oxygen), but not limited thereto. Furthermore, as shown in FIG. 4, bottom electrode layers 221 are formed to fill each of the openings 192, and the bottom electrode layers 221 include a low-resistance metal material such as aluminum, titanium, copper or tungsten, preferably titanium, but not limited thereto. It should be noted that since the second interface layer 210 is located above the first interface layers 200 and below the bottom electrode layers 221, the second interface layer 210 may be functioned like a nucleation layer during the formation of the bottom electrode layers 221, thus shortening the forming time of the bottom electrode layers 221. In addition, the second interface layer 210 may also improve the granular size of the bottom electrode layers 221, thereby reducing the surface roughness thereof. For example, the root mean square roughness (Rq) of the bottom electrode layers 221 may be reduced from 0.814 mm to 0.594 mm, but it is not limited thereto.

Figure 5:
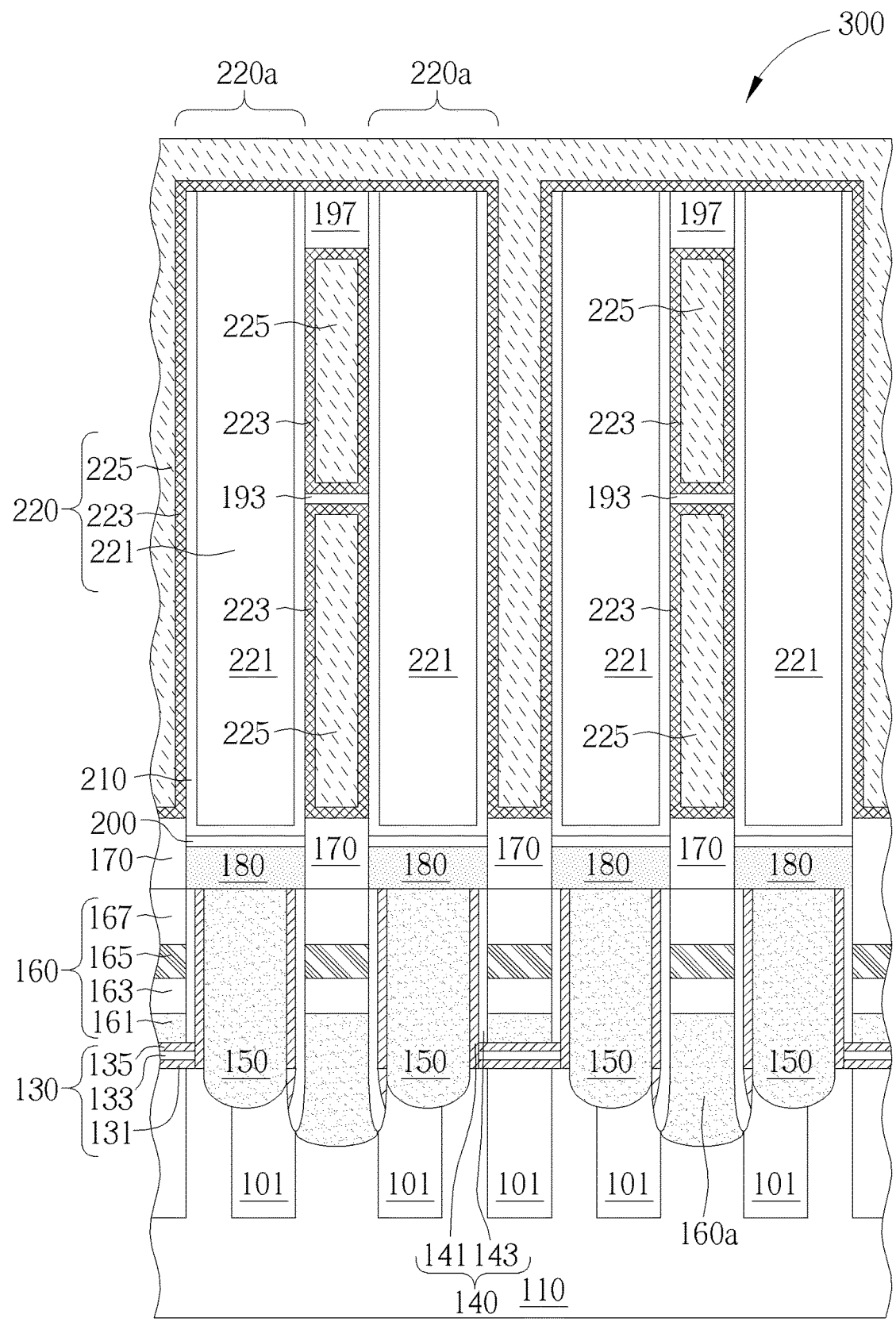

After the bottom electrode layers 221 are formed, an etching process is performed through a mask layer (not shown) to completely remove the oxide layers (such as the first support layer 191 or the third support layer 195) of the support layer structure 190 and partially remove the nitride layers (such as the second support layer 193 or the fourth support layer 197) of the support layer structure 190. Then, as shown in FIG. 5, a capacitor dielectric layer 223 and a top electrode layer 225 are sequentially formed on the bottom electrode layers 221, wherein part of the capacitor dielectric layer 223 and part of the top electrode layer 225 may be further filled between the remaining second support layer 193 and the fourth support layer 197, and between the remaining second support layers 193 and the dielectric layer 170. In one embodiment, the capacitor dielectric layer 223 includes a high dielectric constant dielectric material selected from the group consisting of hafnium oxide ($HfO_2$), hafnium silicon oxide ($HfSiO_4$), hafnium silicon oxynitride (HfSiON), zinc oxide ($ZrO_2$), titanium oxide ($TiO_2$) and zirconia-alumina-zirconia (ZAZ), and preferably zirconia-alumina-zirconia. The top electrode layer 225 includes low resistance metal materials such as aluminum, titanium, copper or tungsten, preferably titanium, but not limited thereto.

Thus, the fabricating process of the capacitor structure 220 is completed. The capacitor structure 220 includes the bottom electrode layers 221, the capacitor dielectric layer 223 and the top electrode layer 225 sequentially stacked, and may form a plurality of vertically extending capacitors 220a as storage nodes (SN) of the semiconductor device 300, which may be electrically connected with transistor elements (not shown) of the semiconductor device 300 through the storage node pads 180 and storage node plugs (i.e. contacts 150). Therefore, the semiconductor device 300 of the present embodiment may form a dynamic random access memory (DRAM) device, in which at least one transistor element and at least one capacitor 220a constitute the smallest memory cell in the DRAM array to receive voltage information from the bit lines 160 and the buried word lines.

Thus, the semiconductor device 300 in the first embodiment of the present invention is completed. In the method for forming the semiconductor device according to the present embodiment, the surface treatments P1 and P2 are additionally performed after the formation of the storage node pads 180 and before the formation of the bottom electrode layers 221 to respectively form the interface layers 200 and 210 above the storage node pads 180 and below the bottom electrode layers 221. Therefore, the granular sizes of the storage node pads 180 and the bottom electrode layers 221 may be improved to reduce the surface roughness through the surface treatments P1 and P2 (through the formation of the interface layers 200 and 210). At the same time, the interface layers 200, 210 formed by the surface treatments P1 and P2 may also be used as nucleation layers for the subsequent formation of the bottom electrode layers 221, thus shortening the forming time of the bottom electrode layers 221, and further forming the semiconductor device 300 having more optimized structure and function on the prerequisite for simplifying the fabricating process.

In addition, it should be easily understood by those skilled in the art that, on the prerequisite for meeting the actual product requirements, there may be other types for forming the semiconductor device and the method for forming thereof according to the present invention, which are not limited to the foregoing. For example, in another one embodiment, the first surface treatment may be omitted to only perform the second surface treatment (forming the interface layer 210). Or optionally, the aforementioned second surface treatment may be omitted to only perform the aforementioned first surface treatment (forming the interface layers 200), which may also achieve the advantages of improving the granular sizes of both the storage node pads and the bottom electrode layers, and shortening the forming time of the bottom electrode layers. Other embodiments or variations of the method for forming the semiconductor device in the present invention will be further described below. To simplify the description, the follow description mainly focuses on the difference of each embodiment, and will not repeat the same description. In addition, the same components in each embodiment of the present invention are labeled with the same reference numerals, so as to facilitate cross-reference among the embodiments.

Please refer to FIGS. 6-10, which illustrate steps of a method for forming a semiconductor device 400 in a second embodiment of the present invention. The forming steps of the front end of the semiconductor device 400 in the present embodiment are substantially the same as the forming steps of the front end of the semiconductor device 300 in the first embodiment described above, as shown in FIGS. 1 to 2, and will not be repeated here. The main difference between the second embodiment and the first embodiment is that after the first interlayer layers 200 are formed, a bottom electrode layer 321 is formed with a multilayer structure, and a third interface layer 330 is formed between the multilayer structure. In other words, the second surface treatment P2 and the formation of the second interface layer 210 in the first embodiment are omitted in the present embodiment.

Figure 6:
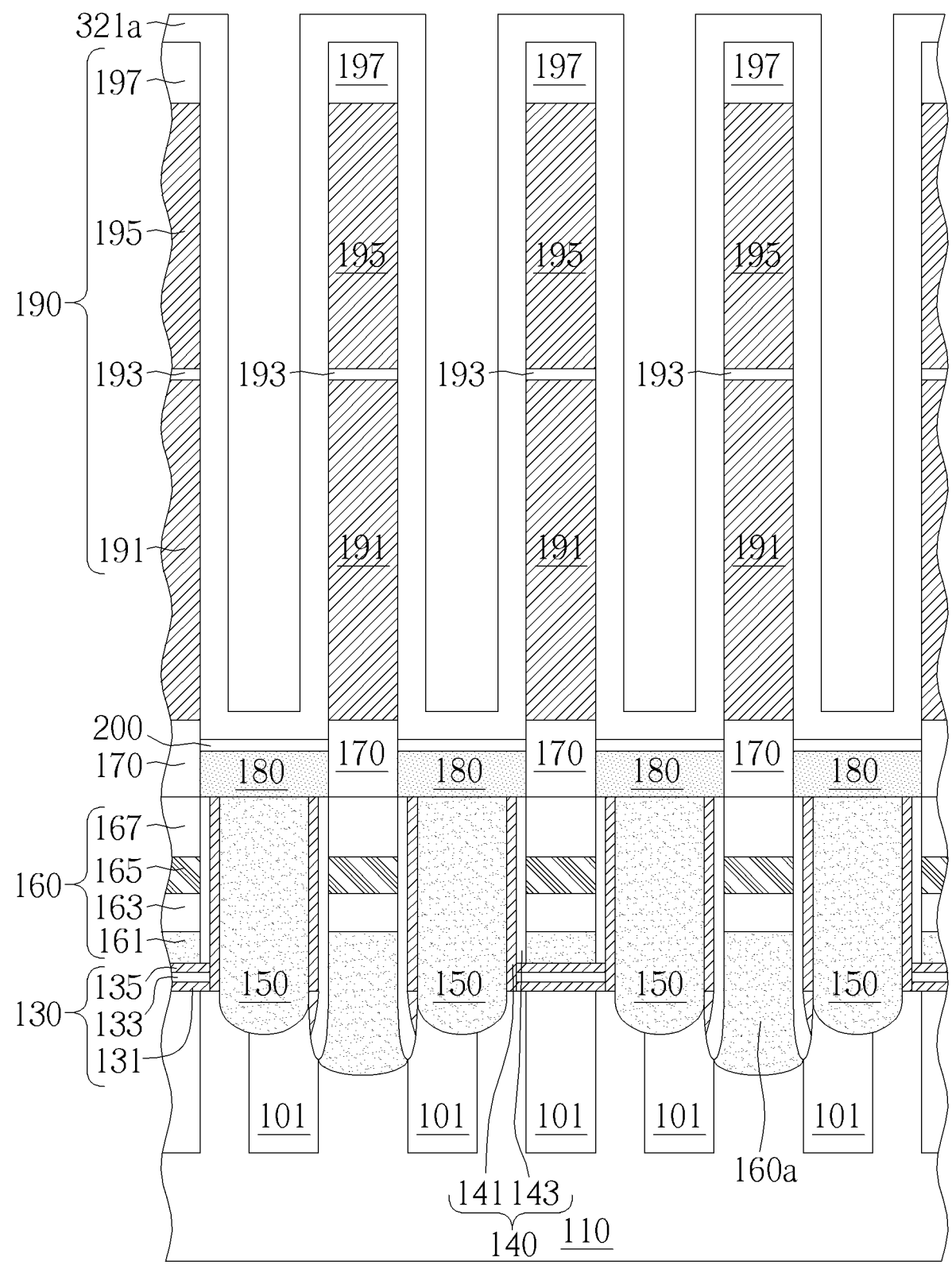
Figure 7:
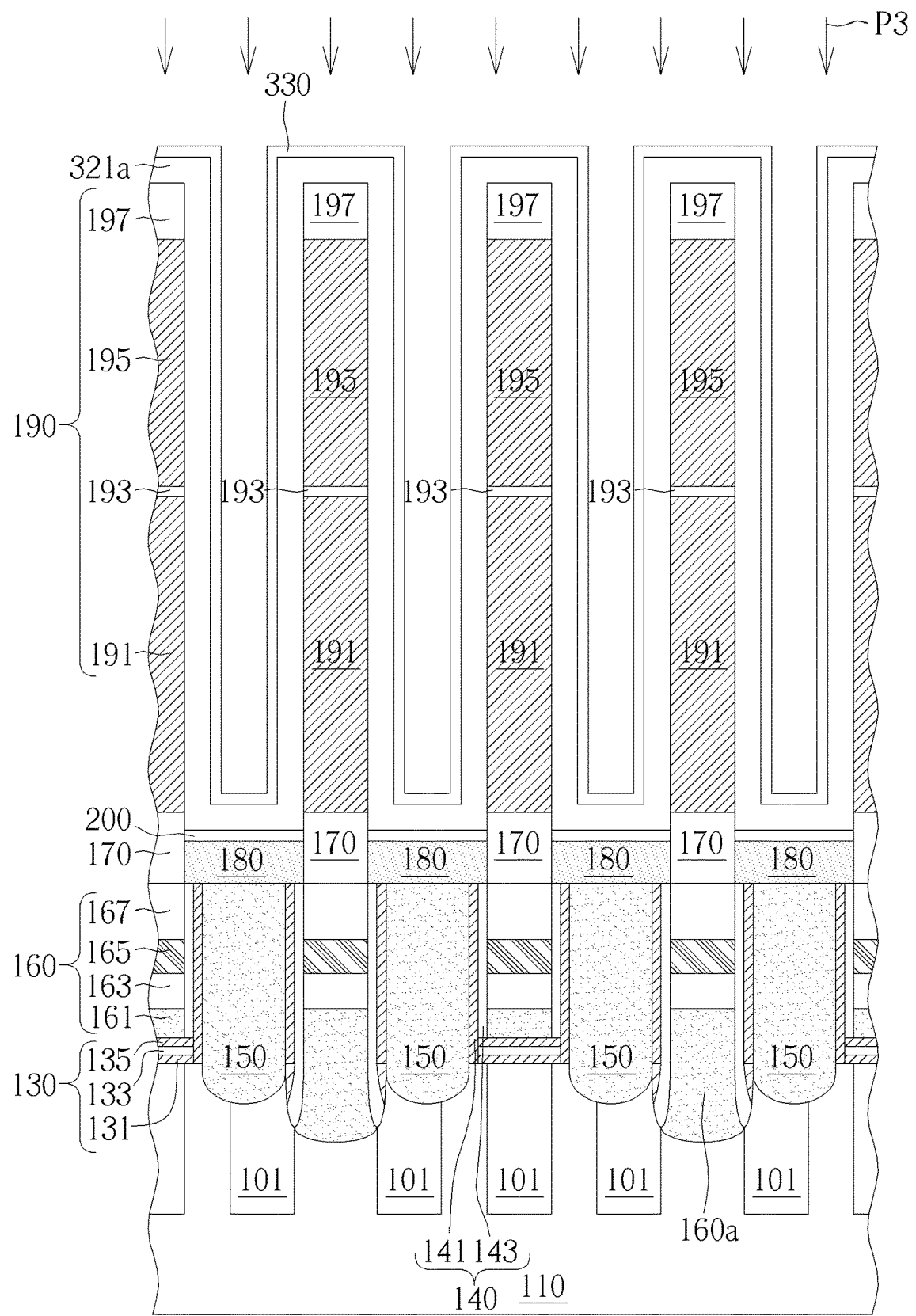
Figure 8:
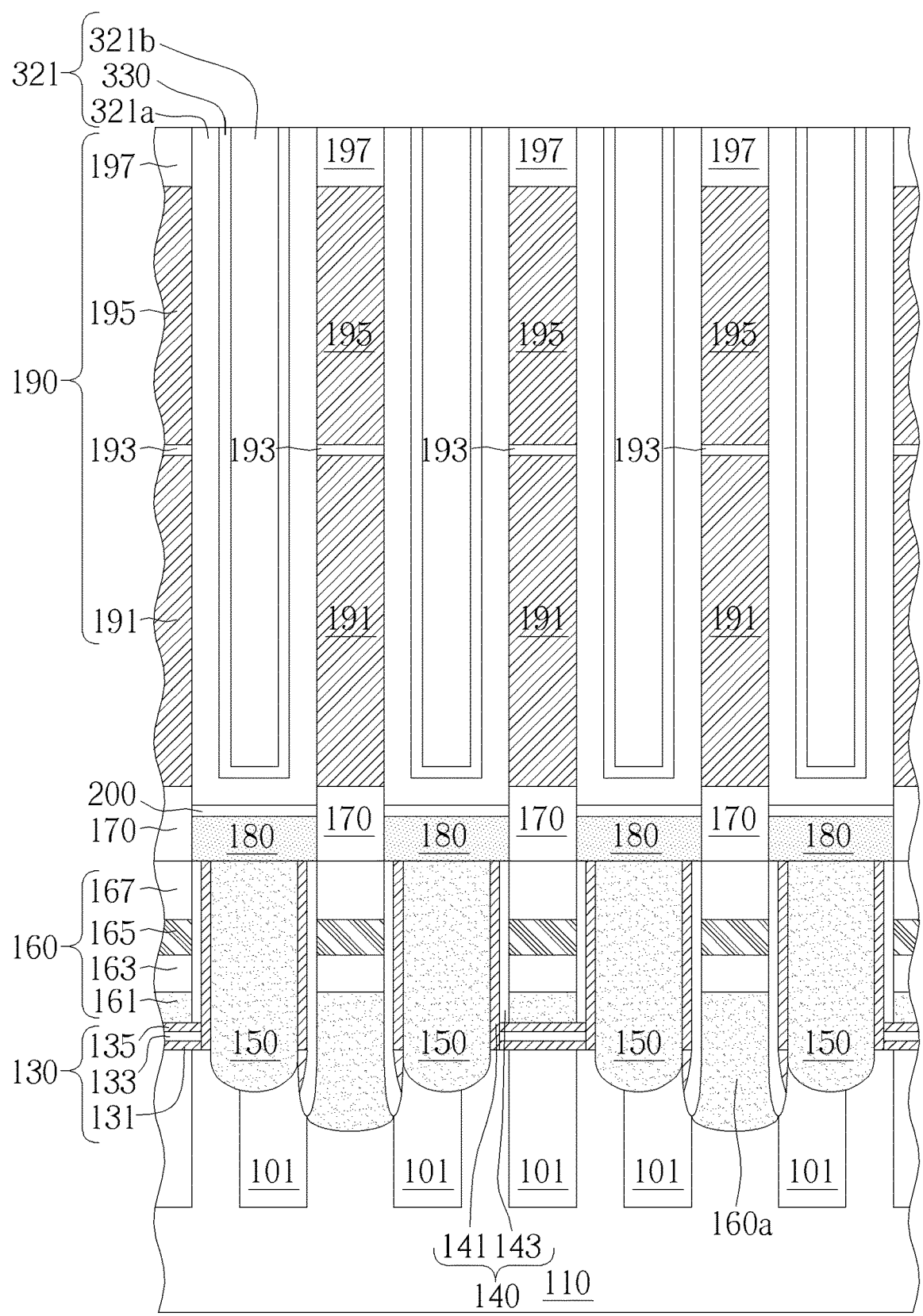

In detail, please refer to FIG. 6, after the first interlayer 200 is formed, a first conductive layer 321a is formed in the openings 192. The first conductive layer 321a continuously and conformally covers the top surface of the support layer 197, the surfaces of the openings 192, and the surfaces of the storage node pads 180. For example, the first conductive layer 321a includes low-resistance metal materials such as aluminum, titanium, copper or tungsten, preferably including titanium, but not limited thereto. Then, as shown in FIG. 7, after the first conductive layer 321a is formed, a third surface treatment P3 is performed in the openings 192 to form a third interface layer 330. In particular, the third surface treatment P3 may also be an ex-situ treatment, in which oxygen is introduced under vacuum relief to perform an oxidation treatment to react with a surface of the first conductive layer 321a, and the third interface layer 330 may be conformally formed on the first conductive layer 321a, as shown in FIG. 7. Therefore, the third interface layer 330 may include a metal oxide material, such as titanium oxide (containing very little oxygen), but not limited thereto. Then, the deposition and etching back processes are sequentially performed to form a second conductive layer 321b filling the openings 192, as shown in FIG. 8. In particular, the second conductive layer 321b includes, for example, the same low-resistance metal material as the first conductive layer 321a, preferably including titanium, but not limited thereto. Therefore, the first conductive layer 321a, the third interface layer 330 and the second conductive layer 321b sequentially filled in each opening 192 may co-constitute the bottom electrode layers 321 of a capacitor structure 320, which is electrically connected with the storage node pads 180 below through the first interface layers 200, and the third interface layer 330 may be disposed between the first conductive layer 321a and the second conductive layer 321b, as shown in FIG. 8. It should be noted that the third interface layer 330 in the present embodiment is formed inside the bottom electrode layer 321. The third interface layer 330 may improve the granular size of the first conductive layer 321a, and thereby reduce the surface roughness of the first conductive layer 321a. For example, the root mean square roughness of the first conductive layer 321a may be reduced from 0.814 mm to 0.594 mm, but not limited to this. Furthermore, the third interface layer 330 may also be functioned like a nucleation layer when the second conductive layer 321b is formed, thereby shortening the forming time of the second conductive layer 321b.

Figure 9:
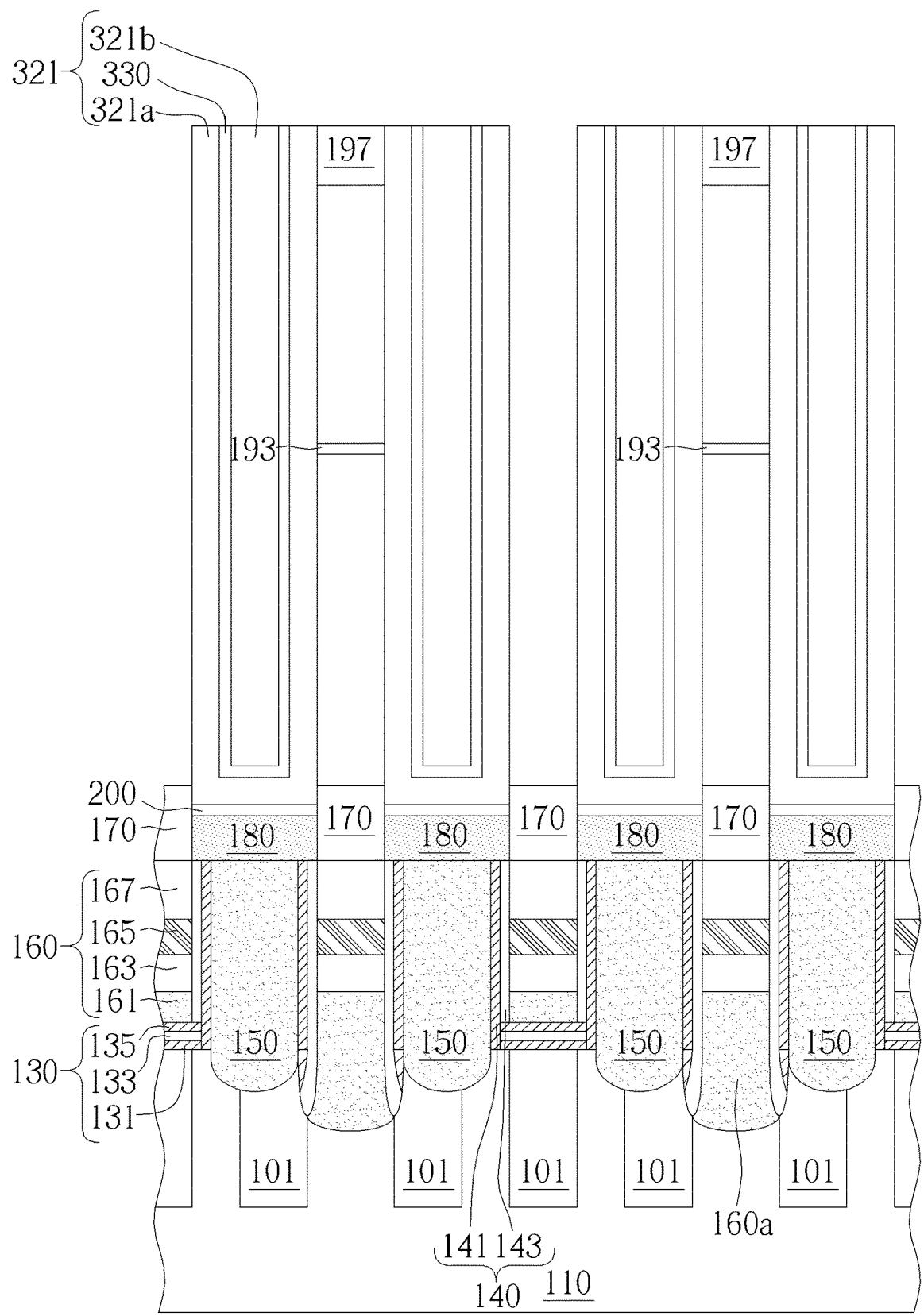
Figure 10:
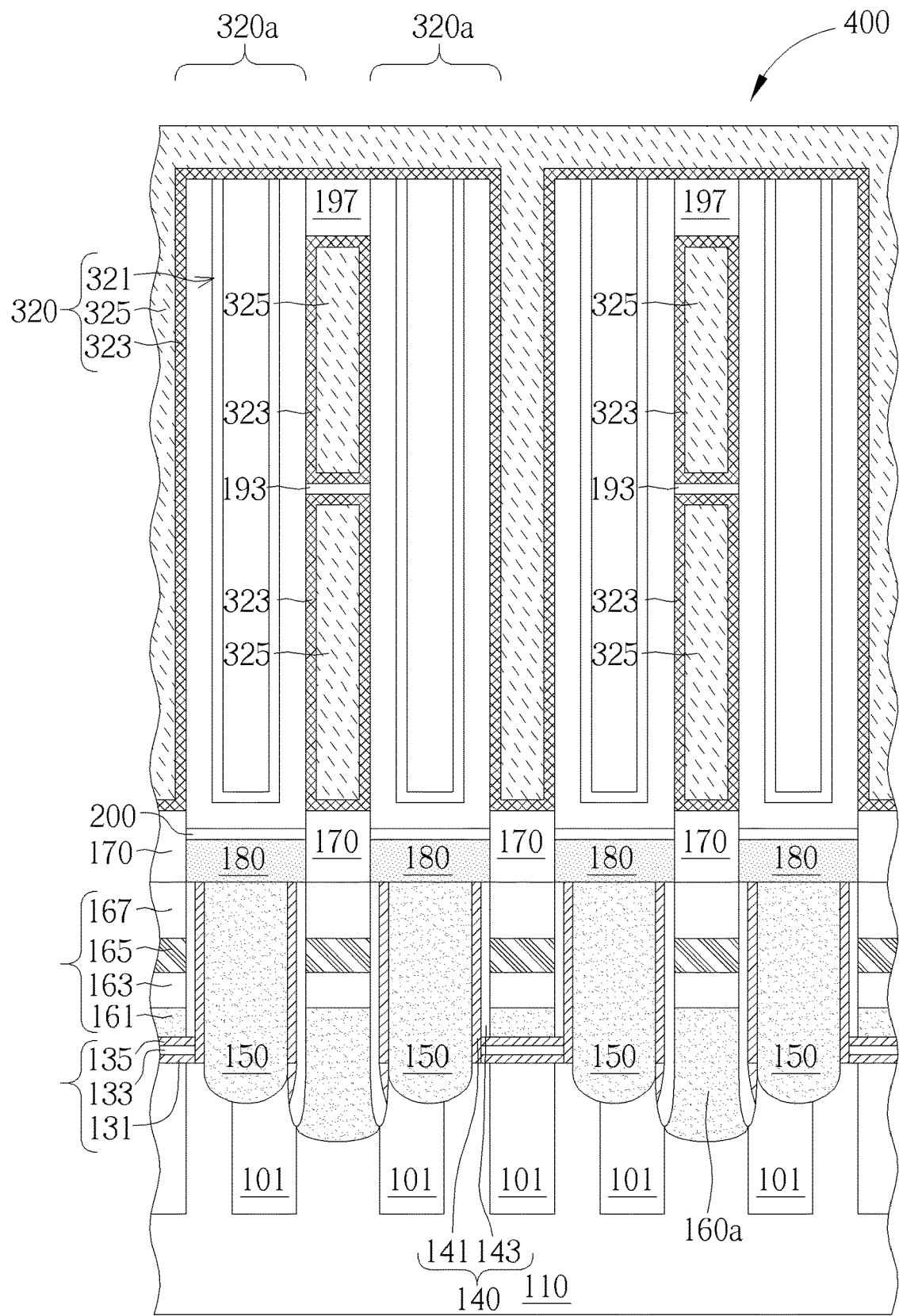

Subsequently, please refer to FIG. 9. After the bottom electrode layer 321 is formed, an etching process is performed through a mask layer (not shown) to completely remove the oxide layers (such as the first support layer 191 or the third support layer 195) of the support layer structure 190 and partially remove the nitride layers (such as the second support layer 193 or the fourth support layer 197) of the support layer structure 190. Then, as shown in FIG. 10, a capacitor dielectric layer 323 and a top electrode layer 325 are sequentially formed on the bottom electrode layers 321 to complete the fabricating process of the capacitor structure 320 in the present embodiment. In particular, the materials of the capacitor dielectric layer 323 and the top electrode layer 325 are selected substantially the same as that of the capacitor dielectric layer 223 and the top electrode layer 225 in the first embodiment, which will not be repeated here. In the present embodiment, part of the capacitor dielectric layer 323 and part of the top electrode layer 325 may also be further filled between the remaining second support layer 193 and the fourth support layer 197, and between the remaining second support layer 193 and the dielectric layer 170, as shown in FIG. 10.

The capacitor structure 320 of the present embodiment includes the bottom electrode layer 321 (including the first conductive layer 321a, the third interface layer 330 and the second conductive layer 321b sequentially stacked), the capacitor dielectric layer 323 and the top electrode layer 325, and may be further electrically connected with transistor elements of the semiconductor device 400 through the storage node pads 180 and storage node plugs (i.e. contacts 150). Therefore, the semiconductor device 400 of the present embodiment may also form a dynamic random access memory device, which is composed of at least one transistor element and at least one capacitor 320a as the smallest unit in the dynamic random access memory array to receive voltage information from the bit lines 160 and the buried word lines.

Thus, the semiconductor device 400 in the second embodiment of the present invention is completed. According to the forming method of the present embodiment, additionally, after the formation of the storage node pads 180 and during the formation of the bottom electrode layer 321 (that is, after the formation of the first conductive layer 321a and before the formation of the second conductive layer 321b), the surface treatments P1 and P3 are performed to form the interface layers 200 and 330 above the storage node pads 180 and inside the bottom electrode layer 321, respectively. Therefore, the granular sizes of the storage node pads 180 and the bottom electrode layer 321 may be improved and the surface roughness thereof may be reduced through the surface treatments P1 and P3 (the formation of the interface layers 200 and 330). At the same time, the interface layers 200, 330 formed by the surface treatments P1, P3 may also be functioned like nucleation layers in the subsequent formation of the bottom electrode layer 321, thus shortening the forming time of the bottom electrode layer 321, and further forming the semiconductor device 400 with more optimized structure and function on the prerequisite for simplifying the fabricating process.

Figure 11:
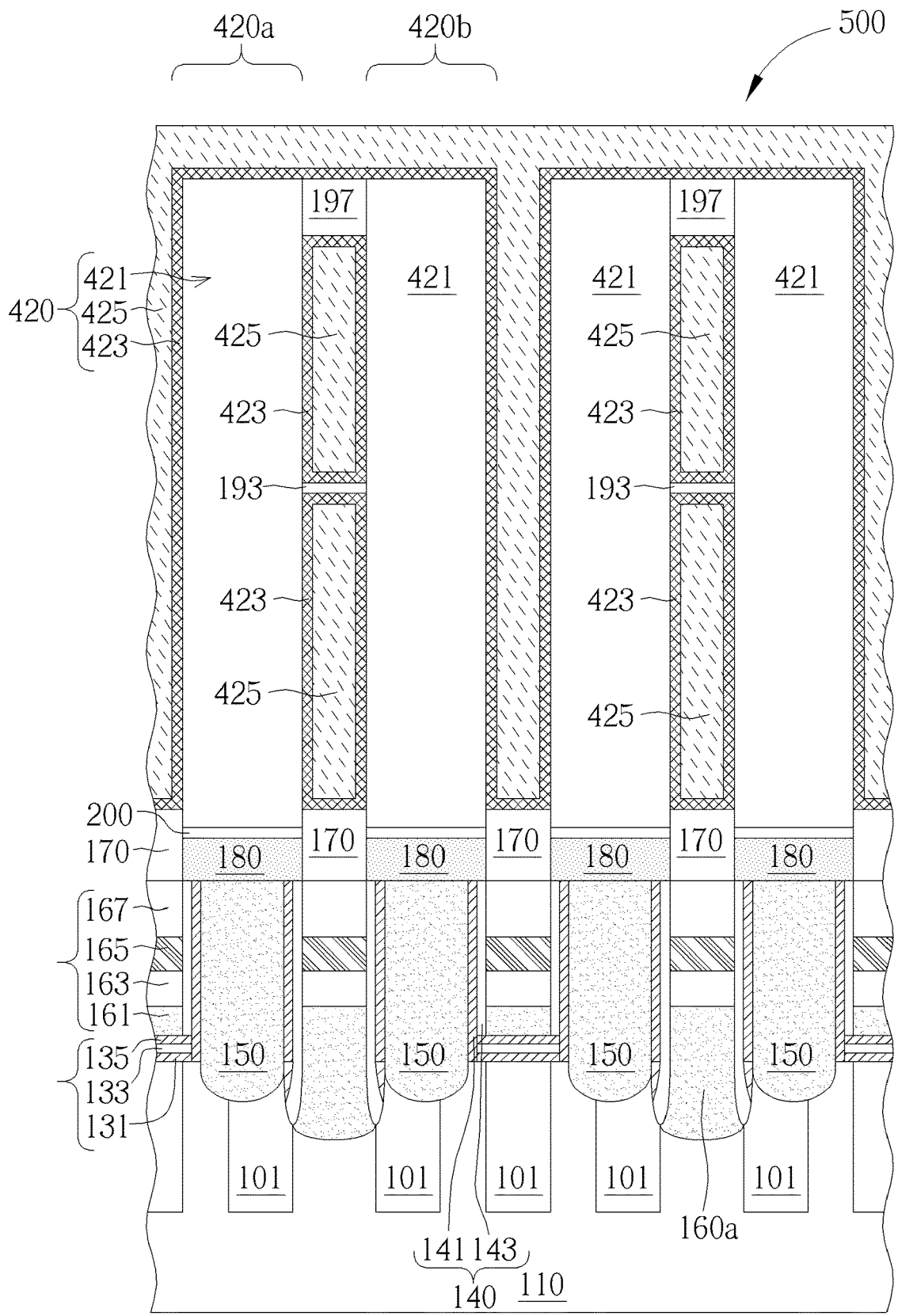
FIG. 11 is a schematic diagram illustrating steps of a method for forming a semiconductor device according to the third embodiment of the present invention.

Please refer to FIG. 11, which shows steps of a method for forming a semiconductor device 500 in a third embodiment of the present invention. The forming steps of the front end of the semiconductor device 500 in the present embodiment are substantially the same as those of the front end of the semiconductor device 300 in the first embodiment described above, as shown in FIGS. 1-2, and will not be repeated here. The main difference between the present embodiment and the first embodiment is that, the second surface treatment P2 and the formation of the second interface layer 210 are omitted, and a capacitor structure 420 is directly formed after the formation of the first interface layers 200.

In detail, please refer to FIG. 11, after the first interlayers 200 are formed, bottom electrode layers 421 are directly formed and filled in each of the openings 192. Then, an etching process is performed through a mask layer (not shown) to completely remove the oxide layers (such as the first support layer 191 or the third support layer 195) of the support layer structure 190, and partially remove the nitride layers (such as the second support layer 193 or the fourth support layer 197) of the support layer structure 190, and then sequentially form a capacitor dielectric layer 423 and a top electrode layer 425 on the bottom electrode layers 421 to complete the fabrication process of the capacitor structure 420. In particular, the materials of the bottom electrode layer 421, the capacitor dielectric layer 423 and the top electrode layer 425 is substantially selected from the same materials of the bottom electrode layer 221, the capacitor dielectric layer 223 and the top electrode layer 225 in the first embodiment described above, and will not be repeated here. In the present embodiment, part of the capacitor dielectric layer 423 and part of the top electrode layer 425 may also be further filled between the remaining second support layer 193 and the fourth support layer 197, and between the remaining second support layer 193 and the dielectric layer 170, as shown in FIG. 11.

Therefore, the capacitor structure 420 of the present embodiment includes the bottom electrode layer 421, the capacitor dielectric layer 423 and the top electrode layer 425 sequentially stacked, which forms a plurality of capacitors 420a extending vertically as storage nodes of the semiconductor device 500, and further electrically connected with transistor elements of the semiconductor device 500 through the storage node pads 180 and storage node plugs (i.e., contacts 150). Therefore, the semiconductor device 500 of the present embodiment may also form a dynamic random access memory device, which is composed of at least one transistor element and at least one capacitor 420a as the smallest unit in the dynamic random access memory array to receive voltage information from the bit lines 160 and the buried word lines. According to the forming method of the present embodiment, the surface treatment P1 is additionally performed after the formation of the storage node pads 180 and before the formation of the bottom electrode layers 421 to form the interface layers 200 above the storage node pads 180. Therefore, the granular sizes of the storage node pads 180 and the bottom electrode layers 421 may be improved and the surface roughness thereof may be reduced through the surface treatment P1 (formation of the interface layers 200). Furthermore, the interface layers 200 formed by the surface treatment P1 may also be functioned like a nucleation layer in the subsequent formation of the bottom electrode layers 421, thus shortening the forming time of the bottom electrode layers 421, and further forming the semiconductor device 500 with more optimized structure and function on the prerequisite for simplifying the fabricating process.

On the whole, the present invention forms interface layers above the storage node pads and/or below or inside the bottom electrode layers through at least one surface treatment to improve the granular sizes of the storage node pads and/or the bottom electrode layers and reduce the surface roughness thereof. At the same time, the interface layers formed by the at least one surface treatment may also be used as nucleation layers when subsequent conductive layers (such as the bottom electrode layers) are formed, so as to effectively shorten the forming time of the conductive layer, and thus, a semiconductor device with more optimized structure and function may be formed on the prerequisite for simplifying the fabricating process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
    a substrate;
    a plurality of bit lines, disposed on the substrate;
    a plurality of contacts, disposed on the substrate, and alternatively and separately disposed with the bit lines;
    a plurality of storage node pads, disposed on the contacts and the bit lines;
    a plurality of capacitors, disposed on the storage node pads, wherein each of the capacitors comprises a bottom electrode layer, a capacitor dielectric layer and a top electrode layer; and
    an interface layer, disposed above each of the storage node pads and surrounding at least a portion of the bottom electrode layer of each of the capacitors, wherein the capacitor dielectric layer contacts a top surface of the interface layer and a top surface of the bottom electrode layer of each of the capacitors.

2. The semiconductor device of claim 1, wherein the bottom electrode layer is provided with a pillar structure.

3. The semiconductor device of claim 1, wherein the interface layer comprises a material consisted of metal oxide.

4. The semiconductor device of claim 1,
    wherein the bottom electrode layer is provided with a composite layer structure, the interface layer is disposed within the composite layer structure.

5. The semiconductor device of claim 4, wherein the composite layer structure comprises a first conductive layer and a second conductive layer sequentially stacked, the interface layer is disposed between the first conductive layer and the second conductive layer, and the first conductive layer and the second conductive layer comprise the same materials.

6. A method for forming a semiconductor device, comprising:
    providing a substrate;
    forming a plurality of bit lines on the substrate;
    forming a plurality of contacts on the substrate, and the bit lines and the contacts are arranged alternatively with each other;
    forming a plurality of storage node pads on the contacts and the bit lines;
    forming a capacitor structure on the storage node pads, wherein forming the capacitor structure comprise:
        forming a support layer structure on the substrate, and the support layer structure comprises at least one oxide layer and at least one nitride layer alternatively stacked;
        forming a plurality of openings in the support layer structure, each of the openings exposes one of the storage node pads;
        forming a plurality of bottom electrode layers in the openings; and
        removing the at least one oxide layer in the support layer structure; and
    performing a first surface treatment on the storage node pads to form the first interface layers, between the storage node pads and the capacitor structure, and the first interface layers comprise a material consisted of metal nitride.

7. The method for forming the semiconductor device of claim 6, wherein the first surface treatment comprises a nitrogen treatment.

8. The method for forming the semiconductor device of claim 6, further comprising:
    after the bottom electrode layers are formed, a capacitor dielectric layer and a top electrode layer are sequentially formed on the bottom electrode layers.

9. The method for forming the semiconductor device of claim 6, further comprising:
    performing a second surface treatment in the openings to form a second interface layer, the second interface layer comprises a material different from the material of the first interface layers.

10. The method for forming the semiconductor device of claim 9,
    wherein the second surface treatment is an ex-situ treatment.

11. The method for forming the semiconductor device of claim 6, wherein the formation of the bottom electrode layers further comprising:
- forming a first conductive layer on the surface of the openings conformally;
- performing a third surface treatment on the first conductive layer to form a third interface layer, the third interface layer comprises a material different from the material of the first interface layers; and
- forming a second conductive layer on the third interface layer, wherein the first conductive layer and the second conductive layer comprise the same materials.

12. The method for forming the semiconductor device of claim 11,
wherein the third surface treatment is an ex-situ treatment.

13. The method for forming the semiconductor device of claim 11,
wherein the second conductive layer fills up the openings.

14. The method for forming the semiconductor device of claim 11,
wherein the third surface treatment is performed under vacuum relief to introduce oxygen for reaction.

\* \* \* \* \*